United States Patent
Barringer et al.

(10) Patent No.: US 6,496,001 B1
(45) Date of Patent: Dec. 17, 2002

(54) SYSTEM AND METHOD FOR PROBE MECHANISM PLANARIZATION

(75) Inventors: Dennis Barringer, Wallkill, NY (US); Donald W. Porter, Highland, NY (US); Roger R. Schmidt, Poughkeepsie, NY (US); Wade H. White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 09/712,669

(22) Filed: Nov. 14, 2000

(51) Int. Cl.[7] ............................................... G01R 31/02
(52) U.S. Cl. ..................... 324/158.1; 324/754
(58) Field of Search ............................. 324/158.1, 754, 324/758, 765

(56) References Cited

U.S. PATENT DOCUMENTS

| | | | |
|---|---|---|---|
| 2,479,597 A | * 8/1949 | Anton | 16/85 |
| 3,613,001 A | 10/1971 | Hostetter | |
| 4,321,122 A | 3/1982 | Whitcomb et al. | |
| 4,812,754 A | * 3/1989 | Tracy et al. | 324/72.5 |
| 4,870,353 A | 9/1989 | Cook | |
| 5,068,601 A | 11/1991 | Parmenter | |
| 5,264,787 A | 11/1993 | Woith et al. | |
| 5,355,080 A | 10/1994 | Sato et al. | |
| 5,436,567 A | * 7/1995 | Wexler et al. | 324/754 |
| 5,461,326 A | 10/1995 | Woith et al. | |
| 5,559,444 A | 9/1996 | Farnworth et al. | |
| 5,729,149 A | * 3/1998 | Bradshaw et al. | 324/754 |
| 5,821,764 A | 10/1998 | Slocum et al. | |
| 5,831,160 A | * 11/1998 | Steketee | 324/754 |

OTHER PUBLICATIONS

Mass Termination Test Probe Fixture; IBM Technical Disclosure Bulletin; vol. 21; No. 2; Jul. 1978; P765–766.
Probe Planarization Tool; Research Disclosure; Dec. 1987; No. 284.

* cited by examiner

Primary Examiner—N. Le
Assistant Examiner—Vincent Q. Nguyen
(74) Attorney, Agent, or Firm—Floyd Gonzalez; Cantor Colburn LLP

(57) ABSTRACT

An exemplary embodiment is a method and apparatus for planarization. The planarization tool has a base which provides the support for the planarization tool. The base has a support hinge mounted on it along with dampening posts and rest posts which support a pivot plate hinged to the support hinge. A pressure assembly is mounted to the pivot plate by retention hardware. The pressure assembly loads a device under test board assembly that is mounted to the pressure assembly with the retention hardware.

11 Claims, 2 Drawing Sheets

SYSTEM AND METHOD FOR PROBE MECHANISM PLANARIZATION

BACKGROUND

Semi-conductor components are generally produced in large quantities. To rapidly test large quantities of components, automatic test equipment (generally "testers") is used. A tester rapidly generates input signals for application to the integrated circuit and can determine whether the appropriate response signals are generated. Because testers are highly automated, they can run through a series of millions of test cases in a few seconds.

To efficiently test integrated circuits, some device is needed to move and quickly connect the device being tested to the tester. To move wafers, a device called a "prober" is used. To move packaged parts a device called "a handler" is used. These devices precisely position the component being tested so that it makes electrical contact with outputs of the tester. Probers, handlers, and other devices for positioning a device under test relative to the test head are called "handling devices".

Semi-conductor test systems are used for testing integrated circuit devices to verify their performance characteristics. For limited volume testing, the integrated circuit device can be placed in a test fixture that is mounted on a device-under-test (DUT) board, or the DUT board can be docked with a semi-conductor wafer prober or package handler for high volume production testing. Conventional testing employs a probe card that is provided with a large number of small tungsten blades or needles that are mechanically and electrically connected to a circuit board and act as test probe contacts. Electrical leads extend from the contacts to the outer edge of the board for connecting the probe card to test circuitry. In use, the blades or needles are moved into engagement with the pads of an integrated circuit. The ends of the test needles or blades must all fall in the same plane in order to assure that each blade or pin makes electrical contact with a pad of the integrated circuit. In order to ensure proper electrical contact, the blades or needles must be adjusted after they have been mounted on the probe card. This adjustment is time consuming and expensive. Even after such adjustment, a loss of adjustment can come about from the pressure of the needles against the chips. As a result, constant maintenance is necessary or the probe cards will not perform their intended function.

A problem arises when the "test head" assembly, currently used on industry testers, docks (comes in contact) with the DUT board assembly. In a wafer test set-up, a test frame is cabled to a movable test head. The movable test head docks with a prober. The prober holds the DUT board assembly and moves product wafers to the probe tips and removes wafers after test. Typical test head assemblies contain electronics and cooling hardware and subsequently are quite heavy (800 to 1200lbs). When the test head assemblies dock with a prober, the hardware which holds the DUT board assembly gets deflected. This deflection causes non-symmetrical distortion of the probe tip plane. The probe mechanism must be adjusted in order to maintain a constant plane between the probe tip plane and the DUT board assembly. In the test head assemblies, once the DUT board assembly is installed into a prober and once a test head has docked, the probe mechanism is very difficult to see, reach and adjust. Because of the time consuming process of adjusting the probe tip plane and the probe mechanism and the difficulty in observing and manipulating the probe mechanism, current systems are inefficient and difficult to use. The non-symmetrical distortion of the probe tip plane and the probe mechanism creates time consuming adjustments. Accordingly, there exists a need for a planarization tool of improved construction.

SUMMARY OF THE INVENTION

An exemplary embodiment is a method and apparatus for planarization. The planarization tool has a base which provides the support for the planarization tool. The base has a support hinge mounted on it along with dampening posts and rest posts which support a pivot plate hinged to the support hinge. A pressure assembly is mounted to the pivot plate by retention hardware. The pressure assembly loads a device under test board assembly that is mounted to the pressure assembly with the retention hardware.

BRIEF DESCRIPTION OF THE DRAWINGS

Referring now to the exemplary drawings wherein like elements are numbered alike in the several FIGURES.

DETAILED DESCRIPTION OF THE PREFERRED EMBODIMENTS

Figure 1:
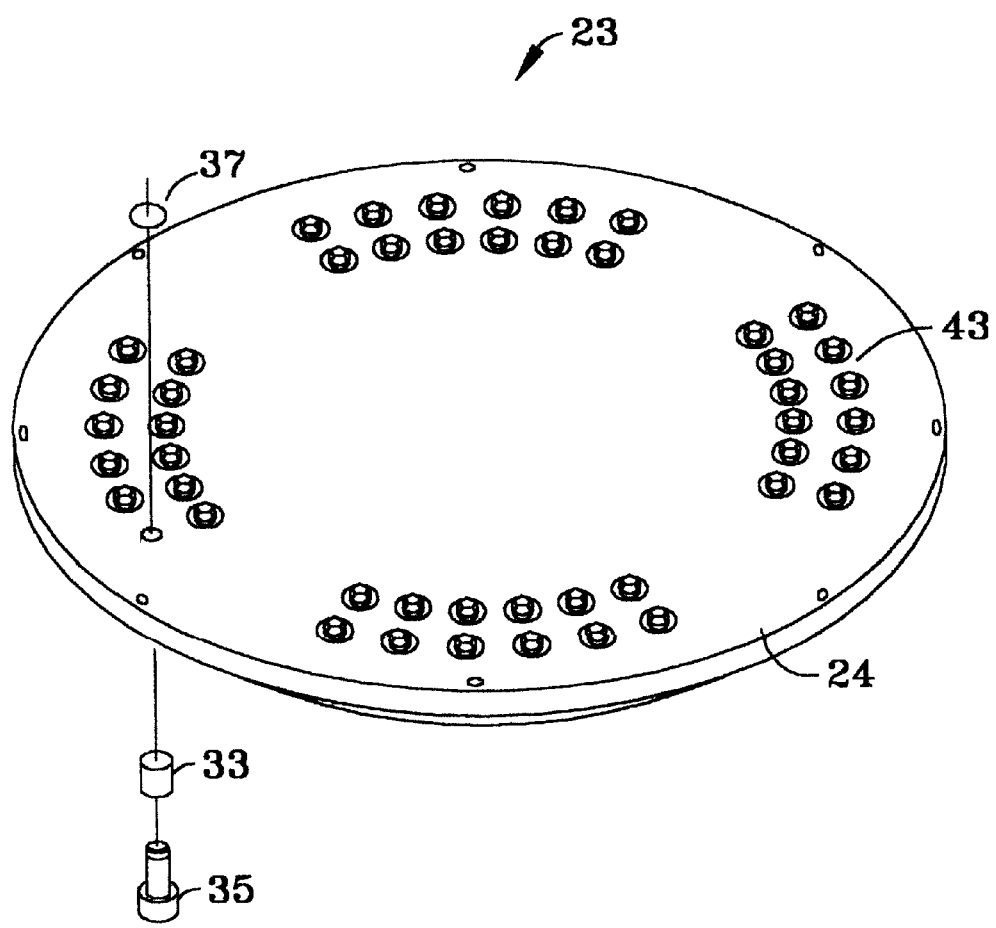
FIG. 1 is a perspective view of an exemplary diagram of a pressure assembly.
Figure 2:
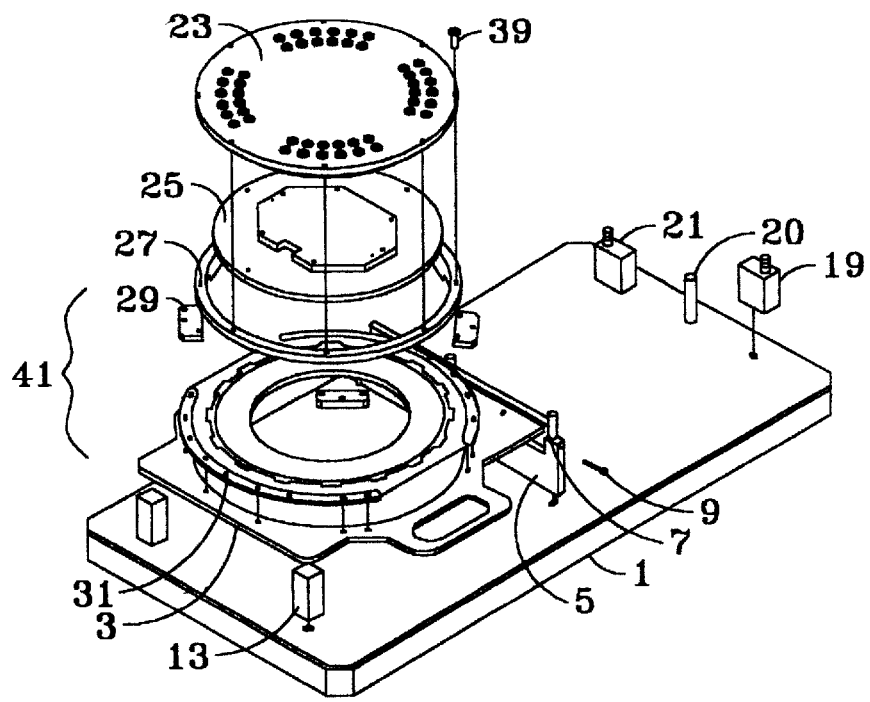
FIG. 2 is a perspective view of an exemplary diagram of a planarization tool.

Referring now to the drawings, FIG. 1 shows a view of a spring loaded plate called a pressure assembly 23 (pressure plate assembly) for pre-loading a device under test (DUT) board assembly 25 (as shown in FIG. 2). In exemplary embodiments the pressure assembly 23 may be formed into any shape. The pressure assembly 23, in one embodiment, has a circular plate or ring called a pressure plate 24 with patterns of bores or holes disposed throughout for receiving a plunger 35. A compression spring 33 disposed around the plunger 35 and situated between the plunger 35 and the pressure plate 24. A lock ring 37 couples the plunger 35, compression spring 33, and pressure plate24.

The compression springs 33 provide a spring force or compression force for the pressure assembly 23 which is translated through the plungers 35 to the DUT board assembly 25. The spring force or load applied to the DUT board assembly 25 deflects the DUT board assembly 25 in a manner that simulates the load applied similar to a probe tip of a test head assembly (not shown) docks with the DUT board assembly 25. In order to apply the loads, the pressure plate 24 has a set of bores to receive assembly screws 39. In a preferred embodiment the pressure plate has a set of six bores for receiving six assembly screws 39.

By arranging and aligning the plurality of plungers 35 into certain patterns with a variety of different compression springs 33, having different spring coefficients or stiffness, a spring array 43 can be set up to simulate a variety of probe tip loads from a variety of test head assemblies. These loads simulate the actual docked loads the DUT board assembly 25 experiences, and these loads resultantly cause the DUT board assembly 25 to deflect. The deflection of the DUT board assembly 25 creates planarity discontinuity or non-symmetrical distortions of the probe tip plane. These planarity distortions cause poor probe tip connections. By loading the DUT board assembly 25 prior to testing (pre-loading), the adjustments in the planarity adjustment mechanism 17 (see FIG. 3) can be performed more easily and with time savings during testing (prior to this invention, the adjustment would have been during testing).

Turning now to FIG. 2, the probe mechanism planarization tool 10 is shown in a perspective view. The retention hardware 41 along with the pressure assembly 23 and the DUT board assembly 25 are shown in an exploded view. The planarization tool 10 has a base 1 that supports the remainder of the tool and provides a reference surface. The base 1 is of a rigid material such as granite block. Mounted on the base 1 is a support hinge 5, a set of rest posts 13 and a set of dampening posts 21 on the opposite end of the base 1. Each dampening post 21 has a dash pot assembly 19 disposed within. The dash pot assembly 19 is used to dampen and control the motion of the pivot plate 3 when it rests on the dampening posts 21. Located in between the dampening posts 21 is a central post 20. The support hinge 5 is mounted on the base 1 near the center of the base 1. Hinged to the support hinge 5 is a pivot plate 3. Additionally, the pivot plate 3 is supported by either the rest posts 13 or the combination of the dampening posts 21 and the central post 20.

The pivot plate 3 is hinged to the support hinge 5 by use of hinge pins 9 disposed through the support hinge 5. A set of hinge spacers 7 are disposed on the hinge pins 9 to maintain the pivotal coupling between the support hinge 5 and the pivot plate 3. The pivot plate 3 can pivot about the support hinge 5 in order to expose one of its two sides for access. While resting on the rest posts 13, the pivot plate 3 is in position to receive the retention hardware 41.

The retention hardware 41 holds fast the pressure assembly 23 and the DUT board assembly 25 to the pivot plate 3. The retention hardware 41 is attached to the pivot plate 3 with a board mounting frame 31. The board mounting frame 31 is mounted directly to the pivot plate 3. Clamped to the board mounting frame 31 is a clamp frame 27. The clamp frame 27 is clamped to the board mounting frame 31 with block clamps 29. In a preferred embodiment, four block clamps 29 clamp the clamp frame 27 to the board mounting frame 31. The DUT board assembly 25 is fixed to the clamp frame 27. Disposed between the pressure assembly 23 and the clamp frame 27 is the DUT board assembly 25. The pressure assembly 23 is torqued to the clamp frame 27, providing the pre-loading to the DUT board assembly 25 that rests in between the pressure assembly 23 and the clamp frame 27. The assembly screws 39, extending through the pressure plate 24 and into the clamp frame 27 are torqued to compress the compression springs 33 of the pressure assembly 23 to apply the pre-loading to the DUT board assembly 25. This pre-loading recreates a non-symmetric loading pattern.

Figure 3:
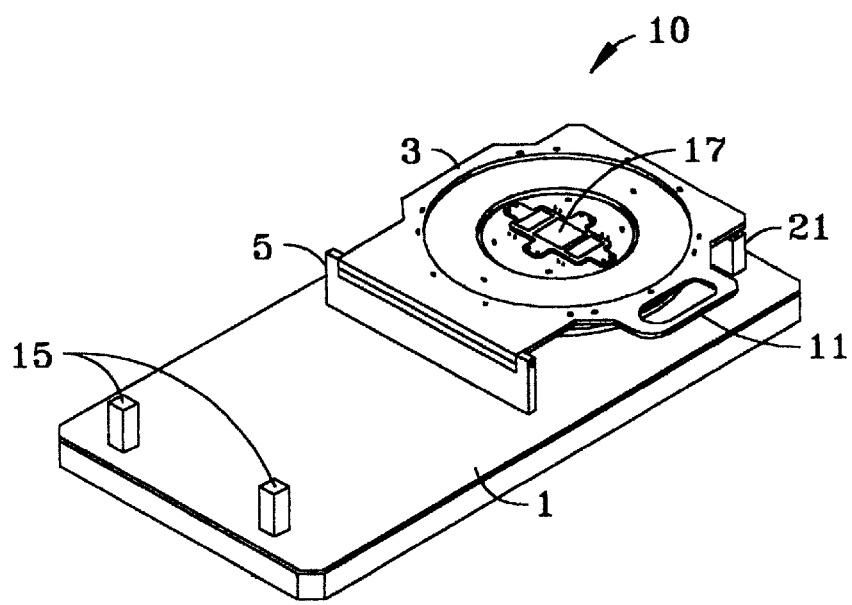
FIG. 3 is a perspective view of an exemplary diagram of a planarization tool ready for adjustmemt and measurement.

Turning now to FIG. 3, the planarization tool 10 is shown in a position ready for adjustment and measurement. The rest posts 13 have support pads 15 disposed on the ends that contact the pivot plate 3. A planarity adjustment mechanism 17 is revealed when the pivot plate is rotated (pivoted), on the support hinge 5, over from contacting the rest posts 13 to contacting the dampening posts 21. The planarity adjustment mechanism 17 is part of the DUT board assembly 25. The probe tips (not shown), also part of the DUT board assembly 25, are exposed in this position. This allows for measurement and adjustment of the probes. While in this exposed position, the DUT board assembly 25 and likewise the probe tips themselves, is adjusted to be planar with the reference surface base 1. The DUT board assembly 25 will be planar to the product wafer to be tested when installed in a prober and put under a test head load.

After adjustment, the pivot plate is returned to rest on the support pads 15 of the rest posts 13. The DUT board assembly 25 is removed. Upon removal, the DUT board assembly 25 will deform. This is due to the removal of the pre-load the pressure assembly 23 had applied. When the DUT board assembly 25 is installed in a prober, and subsequently loaded by the test head, the DUT board assembly 25 will deform back to its adjusted (pre-loaded) but planar state. In other words, the DUT board assembly 25 was pre-stressed with the planarization tool 10 so that the DUT board assembly would not have to be adjusted while under the test head load. By pre-loading and adjusting the DUT board assembly 25, there is no longer a need to waste time adjusting during set-up adjustment of the prober equipment during testing. The invention's adjustment is done outside the prober equipment prior to shipping the hardware to an end user for wafer test.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A probe mechanism planarization tool comprising:
   a base for providing support to said planarization tool;
   a support hinge coupled to said base;
   a pivot plate coupled to said support hinge;
   at least one dampening post mounted on said base between said base and said pivot plate for supporting said pivot plate;
   at least one rest post mounted on said base between said base and said pivot plate opposite said at least one dampening post, for supporting said pivot plate; and
   a pressure assembly mounted to said pivot plate by retention hardware, for loading a device under test board assembly,
   wherein, said retention hardware mounted to said pivot plate includes;
      a board mounting frame mounted directly to said pivot plate;
      a clamp frame clamped to said board mounting frame for fixing said device under test board assembly to said board mounting frame by use of at least one block clamp, coupled to said board mounting frame; and
      a pressure plate mounted to said device under test board assembly, and in combination with and coupled to said clamp frame, said pressure plate retains said device under test board assembly loaded between said pressure plate and said clamp frame.

2. The probe mechanism planarization tool as in claim 1, wherein, said at least one dampening post has a dash pot assembly disposed therein; and
   said at least one rest post has a support pad.

3. The probe mechanism planarization tool as in claim 1, wherein, said pivot plate is hinged to said support hinge by the use of a hinge pin disposed thru said support hinge pivotally coupling said support hinge and said pivot plate and a hinge spacer is mounted on said hinge pin between said pivot plate and said support hinge for maintaining the pivotal coupling between said support hinge and said pivot plate.

4. The probe mechanism planarization tool as in claim 1, wherein, said pressure assembly includes;
   at least one plunger disposed thru said pressure plate;

a compression spring disposed around said plunger abutting said pressure plate, said compression spring provides a spring force for said pressure assembly;

a lock ring coupled to said plunger to movably couple said plunger and said compression spring to said pressure plate, wherein, said pressure assembly loads said device under test board assembly.

5. The probe mechanism planarization tool as in claim 4, wherein, said pressure assembly includes a plurality of said plungers with said compression springs disposed about said plunger movably coupled to said pressure plate by said lock rings.

6. The probe mechanism planarization tool as in claim 5, wherein, said pressure plate and said clamp frame are torqued with assembly screws to compress said compression springs against said device under test board assembly creating a load that recreates a non-symmetric loading pattern.

7. The probe mechanism planarization tool as in claim 6, wherein, said plurality of said plungers are arranged in a spring array about said pressure plate such that said pressure assembly loads said device under test board assembly.

8. The probe mechanism planarization tool as in claim 7, wherein, said spring array is variably arranged to provide of simulated loads to simulate multiple said non-symmetric loading patterns.

9. A method of using a probe mechanism planarization tool comprising:

recreating a non-symmetric loading pattern by adapting a spring array on a pressure assembly;

mounting a device under test board assembly between a clamp frame and said pressure assembly;

mounting said clamp frame to a board mounting frame, wherein said board mounting frame is mounted to a pivot plate which is pivotally hinged to a support hinge attached to a base;

loading said device under test board assembly by torquing assembly screws to compress a pressure plate mounted on said device under test board assembly;

pivoting said pivot plate about said support hinge overturning said retention hardware thereby readying said device under test board assembly for measurement and adjustment;

adjusting said device under test board assembly;

pivoting said pivot plate back onto a rest post; and removing said device under test from the planarization tool.

10. The method of using a probe mechanism planarization tool as in claim 9, wherein, pivoting said pivot plate lifts said pivot plate off of a rest post and over onto a dampening post.

11. A probe mechanism planarization tool comprising:

a base for providing support to said planarization tool;

a support hinge coupled to said base;

a pivot plate coupled to said support hinge;

at least one dampening post mounted on said base between said base and said pivot plate for supporting said pivot plate;

at least one rest post mounted on said base between said base and said pivot plate opposite said at least one dampening post, for supporting said pivot plate; and a pressure assembly mounted to said pivot plate by retention hardware, for loading a device under test board assembly, said pressure assembly including a means configured to bias said device under test board assembly at preselected points thereon.

* * * * *